(12) United States Patent
Gawase et al.

(10) Patent No.: US 12,381,144 B2
(45) Date of Patent: Aug. 5, 2025

(54) SEMICONDUCTOR DEVICE AND METHOD OF MANUFACTURING THE SAME

(71) Applicant: Kioxia Corporation, Tokyo (JP)

(72) Inventors: Akifumi Gawase, Kuwana Mie (JP);
Yimin Liu, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 515 days.

(21) Appl. No.: 17/942,005

(22) Filed: Sep. 9, 2022

(65) Prior Publication Data

US 2023/0307358 A1    Sep. 28, 2023

(30) Foreign Application Priority Data

Mar. 23, 2022  (JP) .................................. 2022-046591

(51) Int. Cl.
  *H01L 23/528*  (2006.01)
  *H01L 21/768*  (2006.01)

(52) U.S. Cl.
  CPC ...... *H01L 23/528* (2013.01); *H01L 21/76802* (2013.01); *H01L 21/76877* (2013.01)

(58) Field of Classification Search
  CPC ............ H01L 23/528; H01L 21/76802; H01L 21/76877; H01L 21/76843; H01L 23/5226; H01L 23/49811; H01L 21/4853; H01L 21/76895; H01L 23/49838; H01L 23/5386
  See application file for complete search history.

(56) References Cited

U.S. PATENT DOCUMENTS

| | | | |
|---|---|---|---|
| 7,919,365 | B2 | 4/2011 | Kim et al. |
| 10,224,242 | B1* | 3/2019 | Yang .................... H01L 23/5283 |
| 2006/0219607 | A1 | 10/2006 | Sato et al. |
| 2014/0014893 | A1 | 1/2014 | Lambertson et al. |
| 2016/0358951 | A1 | 12/2016 | Hsin et al. |
| 2020/0013892 | A1 | 1/2020 | Kataoka et al. |
| 2020/0027840 | A1* | 1/2020 | Briggs ................ H01L 21/4853 |
| 2022/0102191 | A1* | 3/2022 | Fu ......................... H01L 23/5329 |
| 2022/0302320 | A1 | 9/2022 | Gawase et al. |

FOREIGN PATENT DOCUMENTS

| | | |
|---|---|---|
| JP | H6-265938 | 9/1994 |
| JP | 2006-261240 | 9/2006 |
| JP | 2015-95657 | 5/2015 |
| JP | 2019-096856 A | 6/2019 |
| JP | 2020-009911 A | 1/2020 |

* cited by examiner

Primary Examiner — Karen Kusumakar
(74) Attorney, Agent, or Firm — Foley & Lardner LLP

(57) ABSTRACT

A semiconductor device includes first conductive layers, a width in a first direction thereof being a first width, a second conductive layer arranged with first conductive layers, a smaller one of a width in the first direction thereof and a width in a second direction thereof being a second width that is larger than the first width, a third conductive layer in contact with one end portion of at least one of first conductive layers, and a fourth conductive layer in contact with one end portion of the second conductive layer. The at least one of first conductive layers and the second conductive layer contain a first metal, a second metal, and oxygen (O). A concentration of the first metal of the at least one of first conductive layers is higher than a concentration of the first metal of the second conductive layer.

20 Claims, 23 Drawing Sheets

SEMICONDUCTOR DEVICE AND METHOD OF MANUFACTURING THE SAME

CROSS-REFERENCE TO RELATED APPLICATIONS

This application is based upon and claims the benefit of Japanese Patent Application No. 2022-046591, filed on Mar. 23, 2022, the entire contents of which are incorporated herein by reference.

BACKGROUND

Field

Embodiments described herein relate generally to a semiconductor device and a method of manufacturing the same.

Description of the Related Art

There has been known a semiconductor device that includes conductive layers containing a first metal, a second metal different from the first metal, and oxygen (O).

DETAILED DESCRIPTION

Figure 1A:
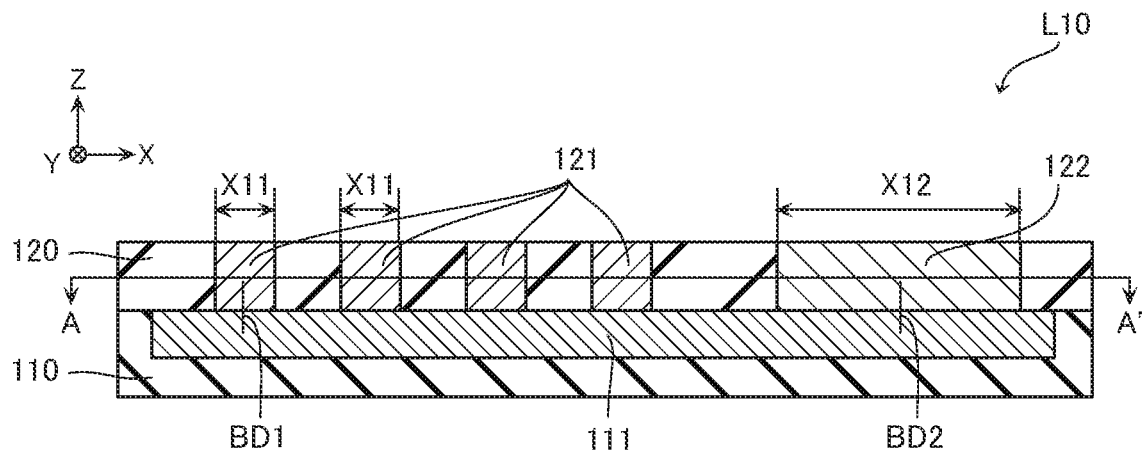
FIG. 1A is a schematic cross-sectional view illustrating a part of a configuration of a semiconductor device according to a first embodiment.

A semiconductor device according to one embodiment comprises: a plurality of first conductive layers arranged in a first direction and a second direction intersecting with the first direction or arranged in the first direction and extending in the second direction, a width in the first direction thereof being a first width; a second conductive layer arranged with the plurality of first conductive layers in the first direction or the second direction, a smaller one of a width in the first direction thereof and a width in the second direction thereof being a second width that is larger than the first width; a third conductive layer in contact with one end portion of at least one of the plurality of first conductive layers in a third direction intersecting with the first direction and the second direction; and a fourth conductive layer in contact with one end portion of the second conductive layer in the third direction. The at least one of the plurality of first conductive layers and the second conductive layer contain a first metal, a second metal different from the first metal, and oxygen (O). A concentration of the first metal of the at least one of the plurality of first conductive layers is higher than a concentration of the first metal of the second conductive layer.

Next, the semiconductor device and methods of manufacturing the same according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

Figure 1B:
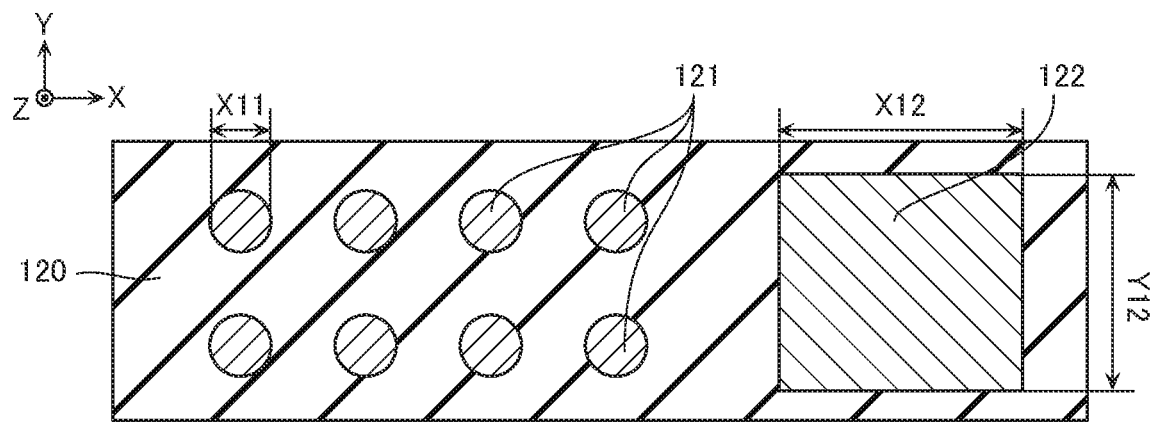
FIGS. 1B and 1C are schematic plan views illustrating a part of the configuration of the semiconductor device according to the first embodiment.

A semiconductor device according to a first embodiment includes a wiring portion L10 as illustrated in FIGS. 1A and 1B. FIG. 1A is a schematic XZ cross-sectional view illustrating a part of a configuration of the wiring portion L10. FIG. 1B is a schematic XY cross-sectional view of the configuration illustrated in FIG. 1A taken along the line A-A' and viewed along an arrow direction.

[Wiring Portion L10]

As illustrated in FIG. 1A, for example, the wiring portion L10 includes an insulating layer 110 disposed on or above a substrate (not illustrated), a conductive layer 111 disposed on an upper surface of the insulating layer 110, an insulating layer 120 disposed on upper surfaces of the insulating layer 110 and the conductive layer 111, and a plurality of conductive layers 121 and a conductive layer 122 disposed so as to penetrate the insulating layer 120 and come in contact with the conductive layer 111. The insulating layer 110 and insulating layer 120 contain, for example, silicon oxide ($SiO_2$) or the like.

The conductive layer 111 functions as, for example, a lower wiring of a semiconductor element disposed above the wiring portion L10. As illustrated in FIG. 1A, for example, the conductive layer 111 extends in the X-direction. The conductive layer 111 contains, for example, at least one of tungsten (W), aluminum (Al), tantalum (Ta), titanium (Ti), nitrogen (N), or silicon (Si). The conductive layer 111 may be, for example, aluminum (Al), tantalum (Ta), titanium (Ti), aluminum nitride (AlN), tantalum nitride (TaN), titanium nitride (TiN), tungsten silicon nitride (WSiN), aluminum silicon nitride (AlSiN), tantalum silicon nitride (TaSiN), titanium silicon nitride (TiSiN), or the like.

The plurality of conductive layers 121 function as, for example, lower electrodes of semiconductor elements. As illustrated in FIG. 1B, for example, the plurality of conductive layers 121 are disposed to be arranged in the X-direction and the Y-direction. Each of the plurality of conductive layers 121 has an approximately circular shape on an XY cross-sectional surface and may have a plug shape. As illustrated in FIG. 1A, for example, lower surfaces in the Z-direction of the plurality of conductive layers 121 are connected to the conductive layer 111. A width in the X-direction of each conductive layer 121 is a width X11. Details of contacts between the conductive layer 111 and the conductive layers 121 will be described later.

The conductive layer 122 functions as, for example, a wiring electrically connected to a semiconductor element and a peripheral circuit. As illustrated in FIGS. 1A and 1B, for example, the conductive layer 122 is disposed to be arranged with the conductive layers 121 in the X-direction. As illustrated in FIG. 1A, for example, a lower surface in the Z-direction of the conductive layer 122 is connected to the conductive layer 111. A width in the X-direction of the conductive layer 122 is a width X12. A width in the Y-direction of the conductive layer 122 is a width Y12. The smaller one of the width X12 and the width Y12 is larger than the width X11 in the X-direction of the conductive layers 121. Details of a contact between the conductive layer 111 and the conductive layer 122 will be described later.

The conductive layers 121 and the conductive layer 122 contain a first metal, a second metal different from the first metal, and oxygen (O). The first metal of the conductive layers 121 has a concentration higher than a concentration of the first metal of the conductive layer 122.

A concentration ratio between the first metal and the second metal of the conductive layer 121 may be higher than a concentration ratio between the first metal and the second metal of the conductive layer 122.

The first metal contains, for example, at least one of tin (Sn), niobium (Nb), titanium (Ti), or tungsten (W). The second metal is, for example, indium (In). The conductive layers 121 and the conductive layer 122 may be, for example, indium tin oxide (InSnO) or the like. Note that, in the following, indium tin oxide may be referred to as ITO.

The higher the concentrations of the first metal in the conductive layers 121 and the conductive layer 122, the larger a strain generated in an atomic bond in a material containing the first metal, the second metal, and oxygen (O) may become. A relationship between the concentration of the first metal and a bond strain will be described later.

In the above description, as illustrated in FIG. 1B, an example in which the plurality of conductive layers 121 are disposed to be arranged in the X-direction and the Y-direction has been illustrated. However, the plurality of conductive layers 121 may be disposed on the XY cross-sectional surface in a shape different from that of the example illustrated in FIG. 1B. For example, FIG. 1C is a schematic XY cross-sectional view of the configuration illustrated in FIG. 1A taken along the line A-A' and viewed along an arrow direction and a drawing illustrating a configuration different from that of FIG. 1B.

Figure 1C:
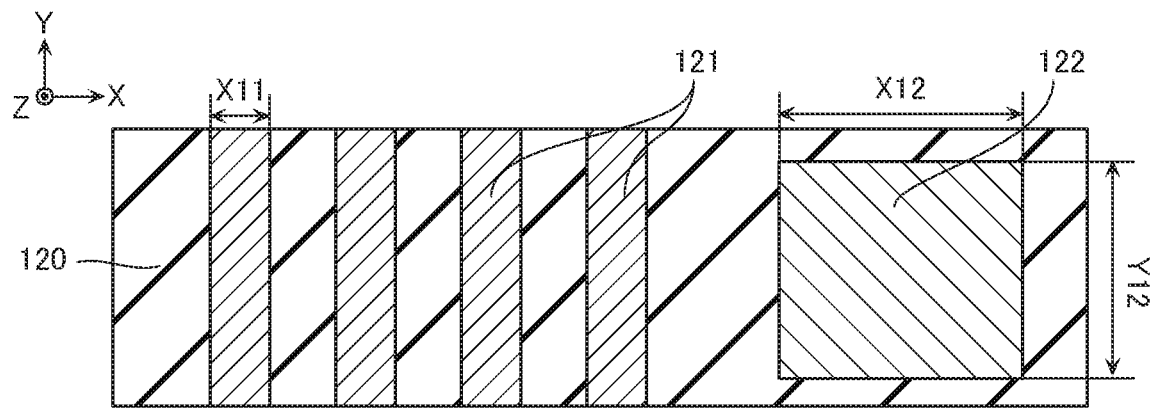

As illustrated in FIG. 1C, the plurality of conductive layers 121 may be disposed to be arranged in the X-direction and extend in the Y-direction. In such a case, similarly to the example illustrated in FIG. 1B, the width in the X-direction of each conductive layer 121 is the width X11. Similarly to the example illustrated in FIG. 1B, even in the example illustrated in FIG. 1C, the smaller one of the width X12 and the width Y12 is larger than the width X11.

In the above description, in FIGS. 1A to 1C, examples in which the conductive layer 122 is arranged with the conductive layers 121 in the X-direction have been described. However, the conductive layer 122 may be arranged with the conductive layers 121 in the Y-direction.

The concentrations of the first metal in the conductive layers 121 and the conductive layer 122 can be measured by a Secondary Ion Mass Spectrometry (SIMS) or the like.

[Manufacturing Method]

Next, with reference to FIG. 2 to FIG. 11, a method of manufacturing the semiconductor device according to the embodiment is described. FIG. 2 to FIG. 11 are schematic cross-sectional views for describing the method of manufacturing the semiconductor device according to the first embodiment and correspond to the part illustrated in FIG. 1A.

Figure 2:
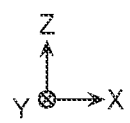
FIG. 2 is a schematic cross-sectional view for describing a method of manufacturing the semiconductor device according to the first embodiment.
Figure 2:

In the manufacturing method, as illustrated in FIG. 2, for example, the insulating layer 110 is formed on or above a substrate (not illustrated). This process is performed by, for example, a method, such as Chemical Vapor Deposition (CVD).

Figure 3:
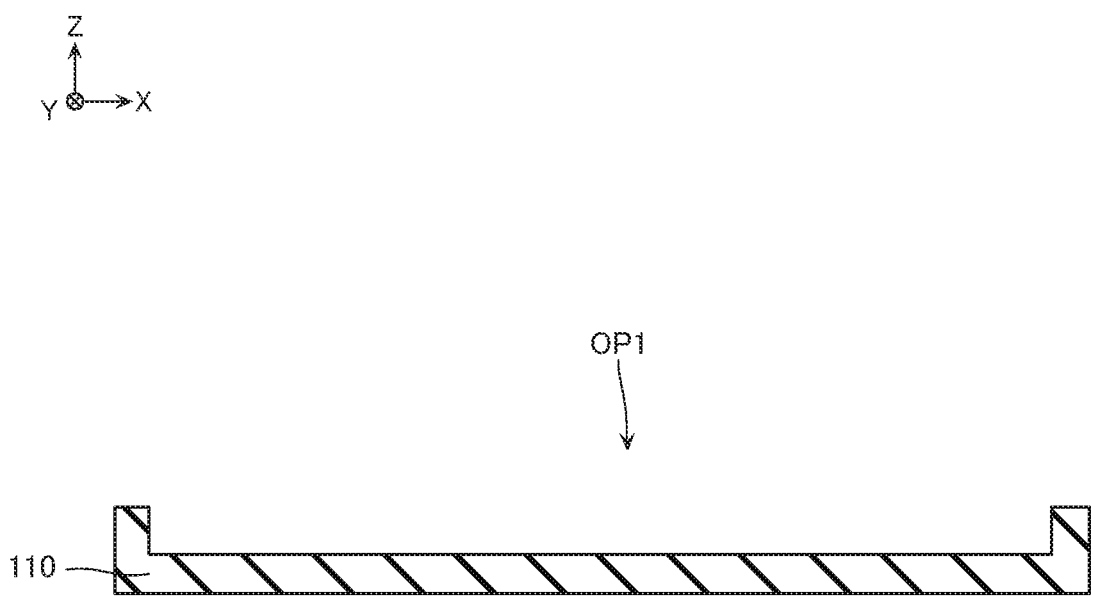
FIG. 3 is a schematic cross-sectional view for describing the manufacturing method.

Next, as illustrated in FIG. 3, for example, an opening OP1 extending in the X-direction is formed in a position corresponding to the conductive layer 111 that is an upper side portion of the insulating layer 110. This process is performed by, for example, a method, such as Reactive Ion Etching (RIE).

Figure 4:
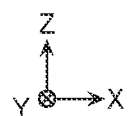
FIG. 4 is a schematic cross-sectional view for describing the manufacturing method.
Figure 4:
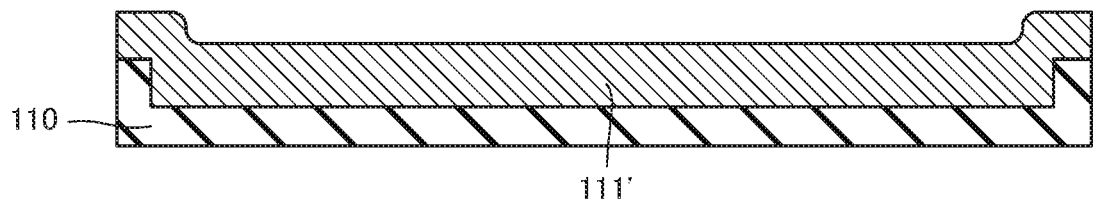

Next, as illustrated in FIG. 4, for example, a conductive layer 111' is formed on an upper surface of the insulating layer 110 and inside the opening OP1. The conductive layer 111' contains, for example, a material similar to that of the conductive layer 111. This process is performed by, for example, sputtering or a method, such as CVD.

Figure 5:
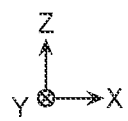
FIG. 5 is a schematic cross-sectional view for describing the manufacturing method.
Figure 5:
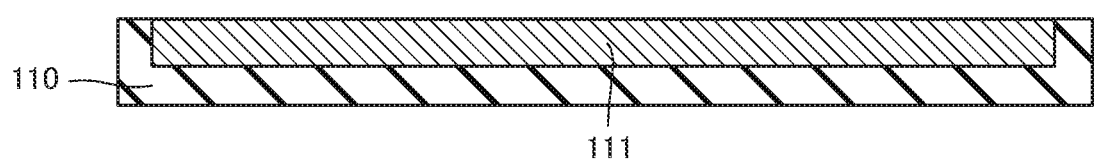

Next, as illustrated in FIG. 5, for example, a part of the conductive layer 111' formed outside a part where the opening OP1 has existed is removed and planarized to form the conductive layer 111. This process is performed by, for example, a method, such as Chemical Mechanical Planarization (CMP).

Figure 6:
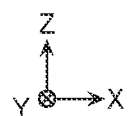
FIG. 6 is a schematic cross-sectional view for describing the manufacturing method.
Figure 6:
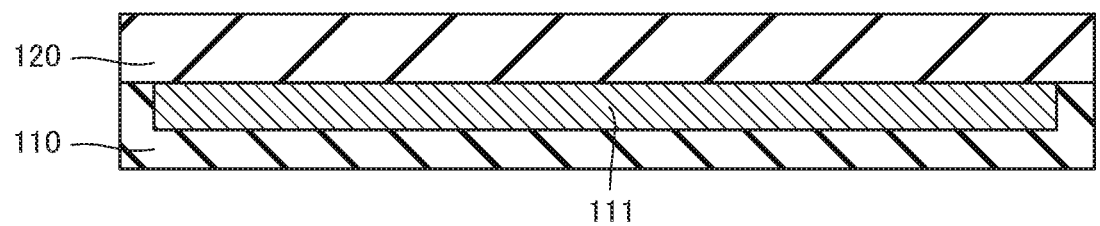

Next, as illustrated in FIG. 6, for example, the insulating layer 120 is formed on the insulating layer 110 and the conductive layer 111. This process is performed by, for example, a method, such as CVD.

Figure 7:
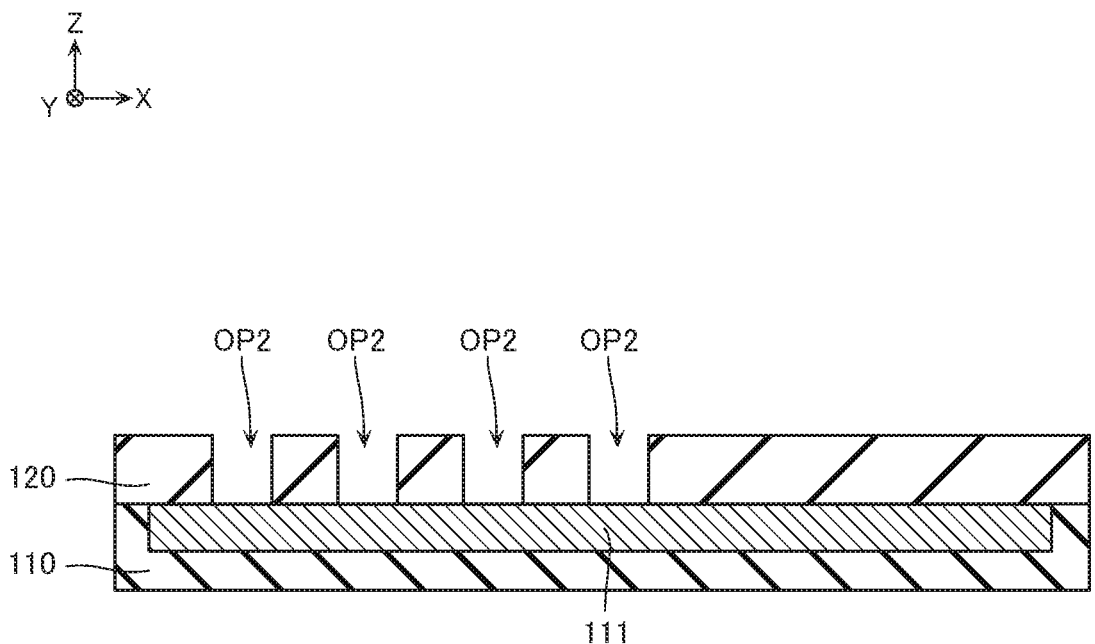
FIG. 7 is a schematic cross-sectional view for describing the manufacturing method.

Next, as illustrated in FIG. 7, for example, a plurality of openings OP2 are formed in positions corresponding to the conductive layers 121 in the insulating layer 120. The openings OP2 extend in the Z-direction and penetrate the insulating layer 120 to expose the conductive layer 111. This process is performed by, for example, a method, such as RIE.

Figure 8:
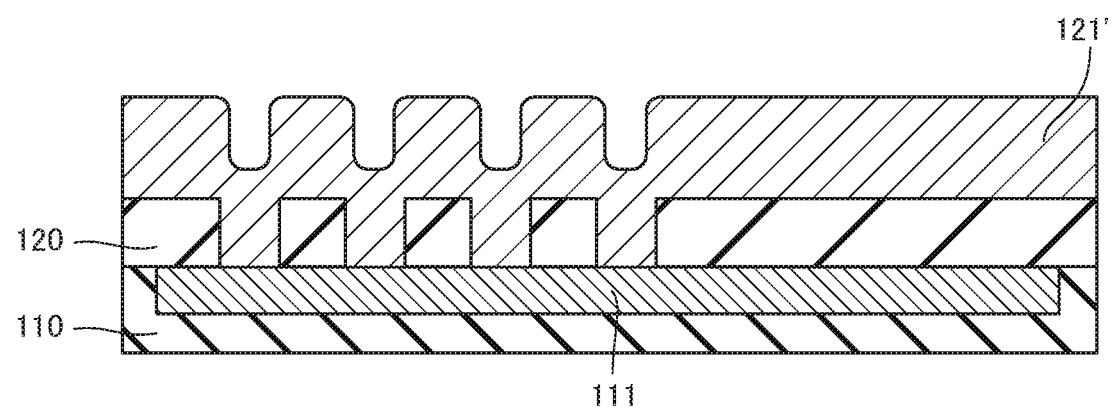
FIG. 8 is a schematic cross-sectional view for describing the manufacturing method.

Next, as illustrated in FIG. 8, for example, a conductive layer 121' is formed on an upper surface of the insulating layer 120 and inside the openings OP2. The conductive layer 121' contains, for example, a material similar to that of the conductive layers 121. This process is performed by, for example, sputtering or a method, such as CVD. Details of this process of forming the conductive layer 121' will be described later.

Figure 9:
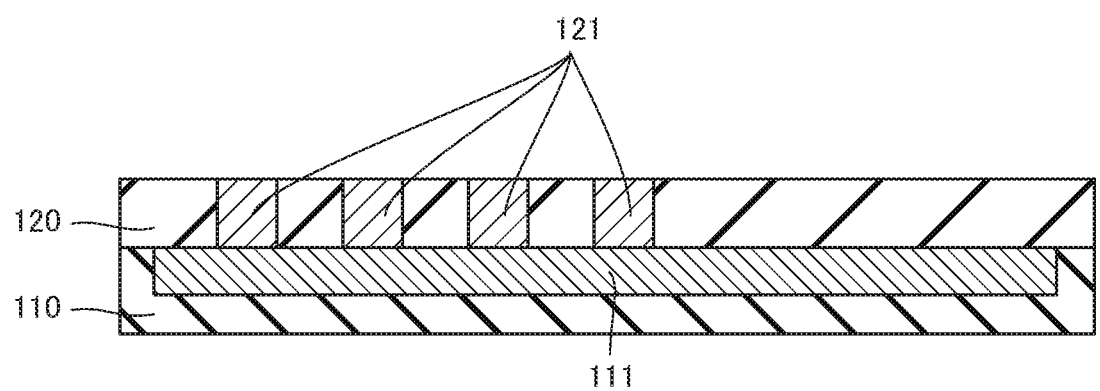
FIG. 9 is a schematic cross-sectional view for describing the manufacturing method.

Next, as illustrated in FIG. 9, for example, a part of the conductive layer 121' formed outside parts where the openings OP2 have existed is removed and planarized to form the plurality of conductive layers 121. This process is performed by, for example, a method, such as Chemical Mechanical Planarization (CMP).

Figure 10:
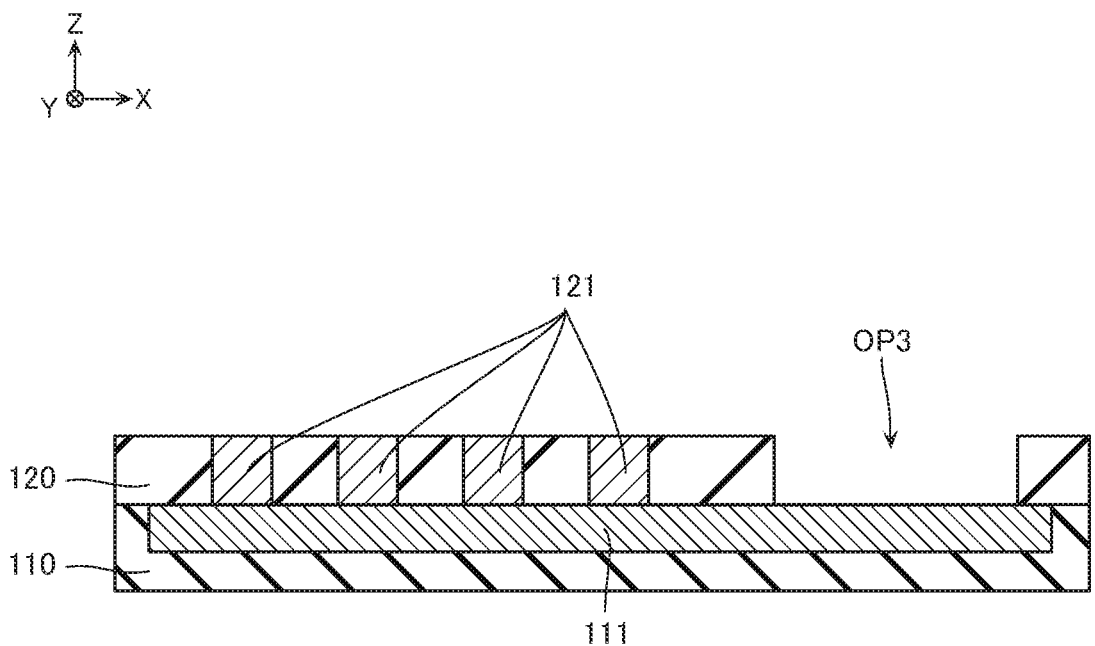
FIG. 10 is a schematic cross-sectional view for describing the manufacturing method.

Next, as illustrated in FIG. 10, for example, an opening OP3 is formed in a position corresponding to the conductive layer 122 in the insulating layer 120. The opening OP3 extends in the Z-direction and penetrates the insulating layer 120 to expose the conductive layer 111. This process is performed by, for example, a method, such as RIE.

Figure 11:
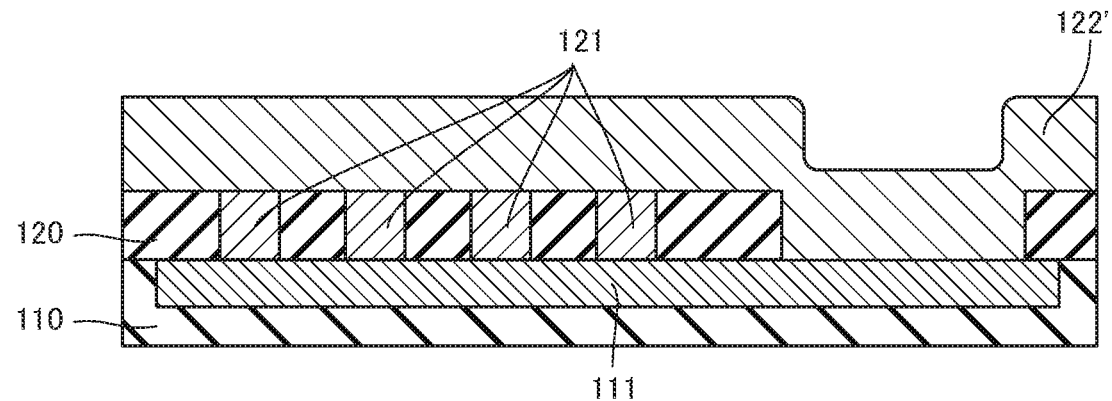
FIG. 11 is a schematic cross-sectional view for describing the manufacturing method.

Next, as illustrated in FIG. 11, for example, a conductive layer 122' is formed on an upper surface of the insulating layer 120 and inside the opening OP3. The conductive layer 122' contains, for example, a material similar to that of the conductive layer 122. This process is performed by, for example, sputtering or a method, such as CVD. Details of this process of forming the conductive layer 122' will be described later.

Next, a part of the conductive layer 122' formed outside a part where the opening OP3 has existed is removed and planarized to form the conductive layer 122, and the structure described with reference to FIGS. 1A to 1C is formed. This process is performed by, for example, a method, such as Chemical Mechanical Planarization (CMP).

[Processes of Forming Conductive Layer 121' and Conductive Layer 122']

The details of the process (FIG. 8) of forming the conductive layer 121' and the process (FIG. 11) of forming the conductive layer 122' are described. Here, an example in which the conductive layer 121' and the conductive layer 122' contain ITO, that is, an example in which the first metal is tin (Sn) and the second metal is indium (In) is described.

First, an example in which each of the processes of forming the conductive layer 121' and the conductive layer 122' is performed by sputtering is described. In such a case, indium tin oxide (InSnO) is used as each sputtering target.

An Sn concentration in the sputtering target in forming the conductive layer 121' is set to be higher than an Sn concentration in the sputtering target in forming the conductive layer 122'. Accordingly, the Sn concentration in the conductive layer 121' can be set to be higher than the Sn concentration in the conductive layer 122'.

Note that the Sn concentration in the conductive layer 121' can be also set to be higher than the Sn concentration in the conductive layer 122' by performing a film formation using a plurality of sputtering targets having different Sn concentrations simultaneously and adjusting respective sputtering conditions (such as an applied voltage) thereof.

Next, an example in which each of the processes of forming the conductive layer 121' and the conductive layer 122' is performed by CVD is described. In such a case, as a source gas used for the CVD, at least an In compound gas and an Sn compound gas are used.

An Sn compound gas flow rate in forming the conductive layer 121' is set to be higher than an Sn compound gas flow rate in forming the conductive layer 122'. Accordingly, the Sn concentration in the conductive layer 121' can be set to be higher than the Sn concentration in the conductive layer 122'.

In the above description, an example in which the first metal that the conductive layer 121' and the conductive layer 122' contain is tin (Sn) and the second metal that the conductive layer 121' and the conductive layer 122' contain is indium (In) has been described. However, even when the first metal and the second metal contain an element other than tin (Sn) or indium (In), similar processes can be used.

For example, when the processes of forming the conductive layer 121' and the conductive layer 122' are performed by sputtering, a concentration of the first metal in the sputtering target in forming the conductive layer 121' may be set to be higher than a concentration of the first metal in the sputtering target in forming the conductive layer 122'.

Additionally, for example, when the processes of forming the conductive layer 121' and the conductive layer 122' are performed by CVD, a flow rate of a compound gas including the first metal in forming the conductive layer 121' may be set to be higher than a flow rate of a compound gas including the first metal in forming the conductive layer 122'.

[Contacts Between Conductive Layer 111 and Conductive Layers 121 and Contact Between Conductive Layer 111 and Conductive Layer 122]

Figure 12:
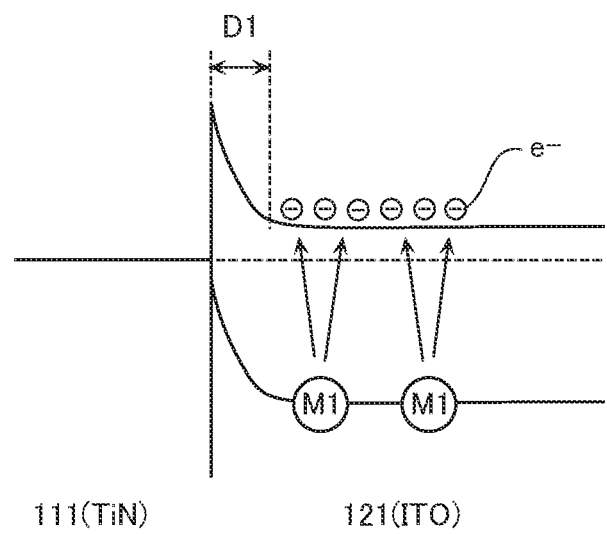
FIG. 12 is a schematic energy band diagram for describing the semiconductor device according to the first embodiment.
Figure 13:
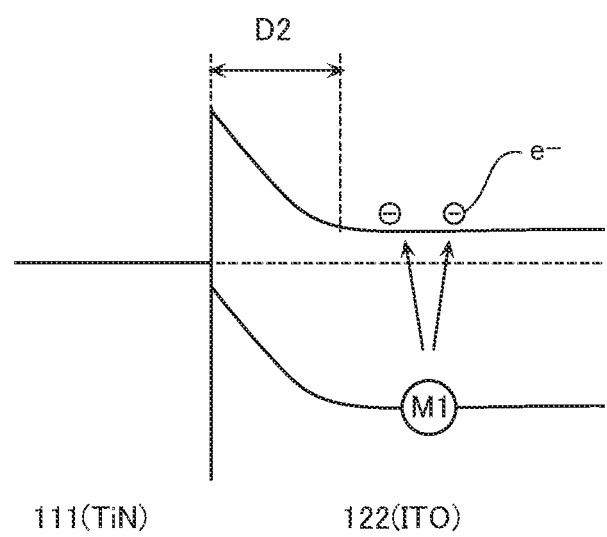
FIG. 13 is a schematic energy band diagram for describing the semiconductor device.

Next, with reference to FIG. 12 and FIG. 13, contacts between the conductive layer 111 and the conductive layers 121 and contact between conductive layer 111 and the conductive layer 122 is described. In FIG. 12 and FIG. 13, examples in which the conductive layer 111 contains titanium nitride (TiN) and the conductive layers 121 and the conductive layer 122 contain ITO are illustrated.

[Contacts Between Conductive Layer 111 and Conductive Layers 121]

FIG. 12 is a schematic energy band diagram in a neighborhood of a contact portion between the conductive layer 111 and the conductive layer 121. FIG. 12 illustrates a bandgap energy of the configuration along a dotted line BD1 in FIG. 1A. The dotted line BD1 passes through the conductive layer 111 and the conductive layer 121 and extends in the Z-direction. A longitudinal direction of a plane of paper in FIG. 12 represents a potential of the electrons, and it is illustrated that the potential of the electrons lowers as heading downward.

As illustrated in FIG. 12, ITO is a material in which carrier electrons are generated in a conduction band by replacing a part of indium (In) in indium oxide (InO) that is an n-type semiconductor with a first metal M1, which is tin (Sn) here. The higher the concentration of tin (Sn) ITO contains, the higher the density of carrier electrons becomes.

As illustrated in FIG. 12, when the conductive layer 121 is ITO, the conductive layer 111 contains titanium nitride (TiN), and the titanium nitride is in contact with the ITO, a contact interface therebetween forms an n-type Schottky barrier junction.

Here, the concentration of the first metal M1, which is tin (Sn) here, in the conductive layer 121 is relatively high. In such a case, as illustrated in FIG. 12, a barrier width D1 of the conductive layer 121 against the conductive layer 111 is relatively small, and a bend of a band of the ITO in the neighborhood of the contact portion becomes steep. In such a case, an interface resistivity between the conductive layer 111 and the conductive layer 121 becomes relatively small.

[Contact Between Conductive Layer 111 and Conductive Layer 122]

FIG. 13 is a schematic energy band diagram in a neighborhood of a contact portion between the conductive layer 111 and the conductive layer 122. FIG. 13 illustrates a bandgap energy of the configuration along a dotted line BD2 in FIG. 1A. The dotted line BD2 passes through the conductive layer 111 and the conductive layer 122 and extends in the Z-direction. A longitudinal direction of a plane of paper in FIG. 13 represents a potential of the electrons, and it is illustrated that the potential of the electrons lowers as heading downward.

As illustrated in FIG. 13, when the conductive layer 122 is ITO, the conductive layer 111 contains titanium nitride (TiN), and the titanium nitride is in contact with the ITO, a contact interface therebetween forms an n-type Schottky barrier junction, similarly to the example illustrated in FIG. 12.

Here, the concentration of the first metal M1, which is tin (Sn) here, in the conductive layer 122 is relatively low. For example, the concentration of tin (Sn) in the conductive layer 122 is lower than the concentration of tin (Sn) in the conductive layers 121. In such a case, as illustrated in FIG. 13, a barrier width D2 of the conductive layer 122 against the conductive layer 111 is larger than the barrier width D1, and a bend of a band of the ITO in the neighborhood of the contact portion becomes gradual. In such a case, an interface resistivity between the conductive layer 111 and the conductive layer 122 becomes relatively high.

In the above description, an example in which the first metal that the conductive layers 121 and the conductive layer 122 contain is tin (Sn) and the second metal is indium (In) has been described. However, the same applies even when the first metal and the second metal are elements other than tin (Sn) or indium (In).

For example, when the concentration of the first metal M1 in the conductive layers 121 is relatively high, a barrier width of the conductive layers 121 against the conductive layer 111 becomes relatively small and the interface resistivity between the conductive layer 111 and the conductive layers 121 becomes relatively small. Further, for example, when the concentration of the first metal M1 in the conductive layer 122 is relatively low, a barrier width of the conductive layer 122 against the conductive layer 111 becomes relatively large and the interface resistivity between the conductive layer 111 and the conductive layer 122 becomes relatively large.

[Concentration of First Metal and Bond Strain]

Next, an example in which the higher the concentrations of the first metal in the conductive layers 121 and the conductive layer 122, the larger the strain generated in the atomic bond in the material containing the first metal, the second metal, and oxygen (O) becomes is described. Here, an example in which the conductive layers 121 and the conductive layer 122 contain ITO is illustrated.

When the concentration of tin (Sn) that ITO contains is relatively high, the strain generated in the bond of indium oxide (InO) becomes large. The larger a volume of the formed ITO, the larger a total quantity of such a strain becomes. Thus, when the bond strain is large, failures, such as stress migration by heat treatment to ITO and electromigration by electrical conduction in ITO, are likely to occur.

While the above description relates to ITO, the same applies to the case of other materials containing the first metal, the second metal, and oxygen (O). For example, the higher the concentration of the first metal, the larger the bond strain in the material containing the first metal, the second metal, and oxygen (O) becomes.

[Effect]

In the semiconductor device according to the embodiment, the concentration of the first metal is high in a wiring in which the width X11 is relatively small similarly to the conductive layers 121. Additionally, in a wiring in which the width X12 and the width Y12 are relatively large similarly to the conductive layer 122, the concentration of the first metal is low.

In such a configuration, similarly to a contact between the conductive layers 121 and the conductive layer 111, when a contact area is relatively small and a contact resistance easily increases, the interface resistivity can be set to be relatively small by increasing the concentration of the first metal of the conductive layers 121. Therefore, even when the contact area is relatively small similarly to the contact between the conductive layers 121 and the conductive layer 111, the contact resistance can be lowered, and satisfactory conduction can be ensured.

Additionally, in such a configuration, similarly to a contact between the conductive layer 122 and the conductive layer 111, when a contact area is relatively large, the bond strain in the material can be reduced to be small by lowering the concentration of the first metal of the conductive layer 122. Therefore, even in the conductive layer 122 having a relatively large volume, the total quantity of the strain can be set to be relatively small and the occurrence of the failures, such as stress migration and electromigration, can be reduced. By thus reducing the total quantity of the strain to be relatively small, contact strength of the conductive layer 122 and the conductive layer 111 can be increased, pattern peeling and the like can be restrained especially in a CMP process, and a process reliability can be enhanced.

Modification 1 of First Embodiment

Figure 14:
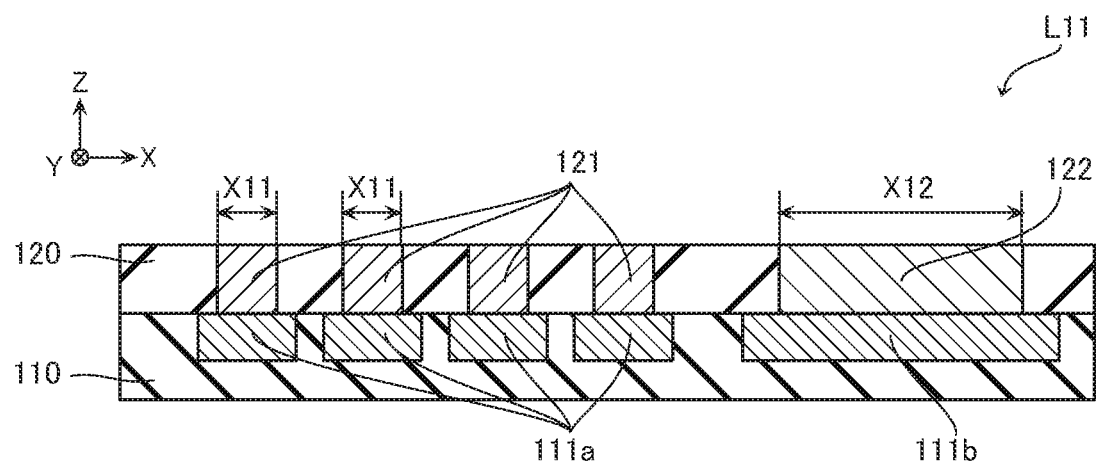
FIG. 14 is a schematic cross-sectional view for describing a modification 1 of the semiconductor device.

Next, with reference to FIG. 14, a modification 1 of the semiconductor device according to the first embodiment is described. FIG. 14 is a schematic cross-sectional view illustrating a part of a configuration of the semiconductor device according to the modification.

The semiconductor device according to the modification 1 of the first embodiment includes, for example, a wiring portion L11 as illustrated in FIG. 14.
[Wiring Portion L11]

In the wiring portion L11, the conductive layer 111 similar to that in the wiring portion L10 of the first embodiment is not disposed. However, in the wiring portion L11, a plurality of conductive layers 111a and a conductive layer 111b are disposed separately from each other on an upper surface of the insulating layer 110.

The plurality of conductive layers 111a function as, for example, a plurality of lower wirings of a plurality of semiconductor elements. The plurality of conductive layers 111a are disposed, for example, to be arranged in the X-direction in positions corresponding to the plurality of conductive layers 121 and extend in the Y-direction. Each of the plurality of conductive layers 111a is contacted to each of lower surfaces in the Z-direction of the plurality of conductive layers 121. The plurality of conductive layers 111a contain, for example, a material similar to that of the conductive layer 111.

The conductive layer 111b functions as, for example, a dummy pattern or a wiring in a peripheral circuit electrically connected to a semiconductor element. The conductive layer 111b is disposed, for example, in a position corresponding to the conductive layer 122. The conductive layer 111b is contacted to a lower surface in the Z-direction of the conductive layer 122. The conductive layer 111b contains, for example, a material similar to that of the conductive layer 111.

In the above description, an example in which the plurality of conductive layers 111a are disposed to be arranged in the X-direction and extend in the Y-direction has been illustrated. However, the plurality of conductive layers 111a may be disposed to be arranged in the X-direction and the Y-direction.

Modification 2 of First Embodiment

Next, with reference to FIGS. 15A and 15B to FIG. 17, a modification 2 of the semiconductor device according to the first embodiment is described.
[Wiring Portion L12]

Figure 15A:
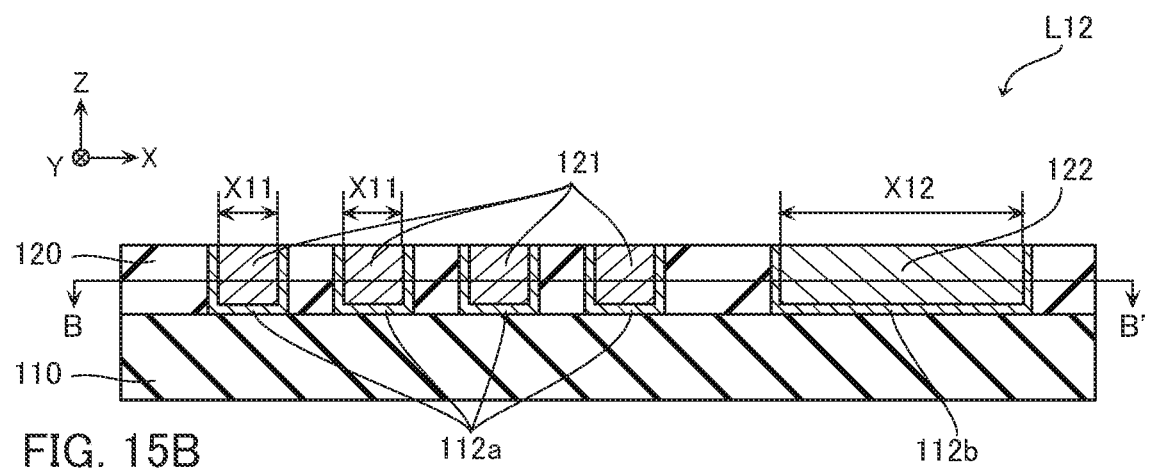
FIG. 15A is a schematic cross-sectional view for describing a modification 2 of the semiconductor device.
Figure 15B:
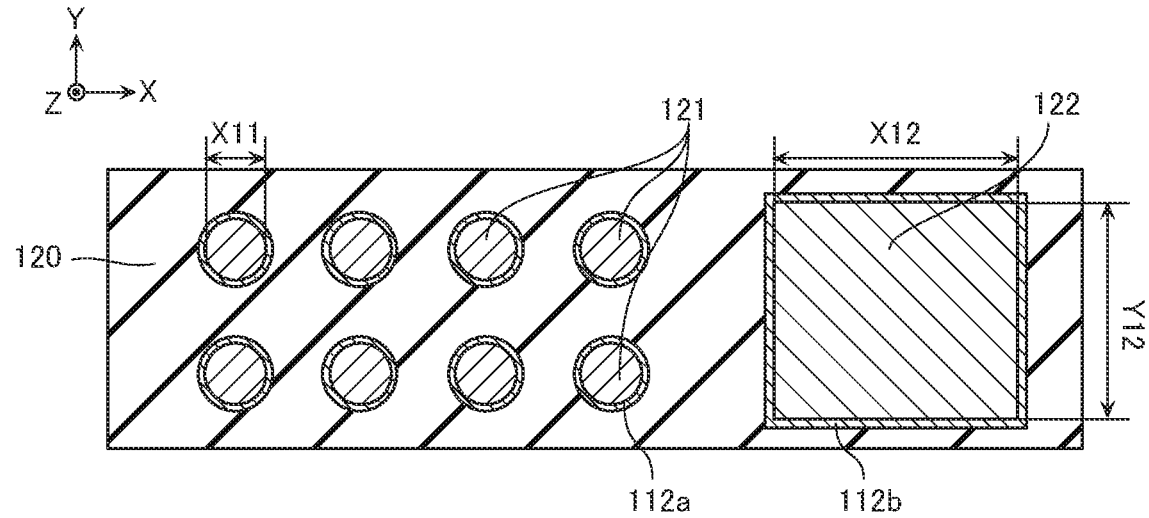
FIG. 15B is a schematic plan view for describing the modification 2 of the semiconductor device.

The semiconductor device according to the modification 2 of the first embodiment may include, for example, a wiring portion L12 as illustrated in FIGS. 15A and 15B. FIG. 15A is a schematic XZ cross-sectional view illustrating a part of a configuration of the wiring portion L12. FIG. 15B is a schematic XY cross-sectional view of the configuration illustrated in FIG. 15A taken along the line B-B' and viewed along an arrow direction.

In the wiring portion L12, the conductive layer 111 similar to that in the wiring portion L10 of the first embodiment is not disposed. However, in the wiring portion L12, as illustrated in FIGS. 15A and 15B, for example, conductive layers 112a that are in contact with outer peripheral surfaces of the conductive layers 121 are disposed. Further, in the wiring portion L12, a conductive layer 112b that is in contact with outer peripheral surfaces of the conductive layer 122 is disposed.

The plurality of conductive layers 112a function as, for example, layers that avoid oxygen (O) omission from the conductive layers 121 and adhesive layers in a CMP process. Each of the plurality of conductive layers 112a covers each of the outer peripheral surfaces in the XY cross-sectional surface of the plurality of conductive layers 121 and each of lower end surfaces in the Z-direction of the conductive layers 121. The plurality of conductive layers 112a are disposed to be arranged in the X-direction and the Y-direction corresponding to the plurality of conductive layers 121. The plurality of conductive layers 112a contain, for example, a material similar to that of the conductive layer 111. The conductive layers 112a are, for example, titanium nitride (TiN), and the conductive layer 111 is, for example, tungsten (W).

The conductive layer 112b functions as, for example, a layer that avoids oxygen (O) omission from the conductive layer 122 and an adhesive layer in a CMP process. The conductive layer 112b is disposed so as to cover the outer peripheral surfaces in the XY cross-sectional surface of the conductive layer 122 and a lower end surface in the Z-direction of the conductive layer 122. The conductive layer 112b contains, for example, a material similar to that of the conductive layer 111.

In the above description, an example in which the plurality of conductive layers 112a are disposed corresponding to the plurality of conductive layers 121 disposed to be arranged in the X-direction and the Y-direction has been illustrated. However, the plurality of conductive layers 112a may correspond to the plurality of conductive layers 121 disposed to be arranged in the X-direction and extend in the Y-direction and may cover both end surfaces in the X-direction of the conductive layers 121 and the lower end surfaces in the Z-direction of the conductive layers 121.
[Wiring Portion L13]

Figure 16:
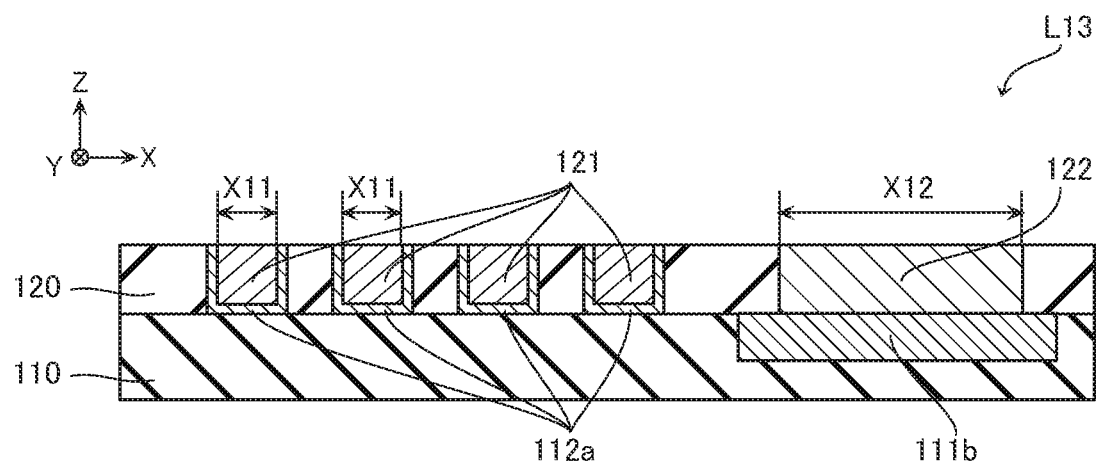
FIG. 16 is a schematic cross-sectional view illustrating a part of a configuration of the modification 2 of the semiconductor device.

The semiconductor device according to the modification 2 of the first embodiment may include, for example, a wiring portion L13 as illustrated in FIG. 16. FIG. 16 is a schematic XZ cross-sectional view illustrating a part of a configuration of the wiring portion L13.

In the wiring portion L13, the conductive layer 111 similar to that in the wiring portion L10 of the first embodiment is not disposed. However, in the wiring portion L13, the above-described conductive layers 112a that are in contact with the outer peripheral surfaces of the conductive layers 121 are disposed. Further, in the wiring portion L13, the above-described conductive layer 111b that is in contact with the lower end surface in the Z-direction of the conductive layer 122 is disposed.
[Wiring Portion L14]

Figure 17:
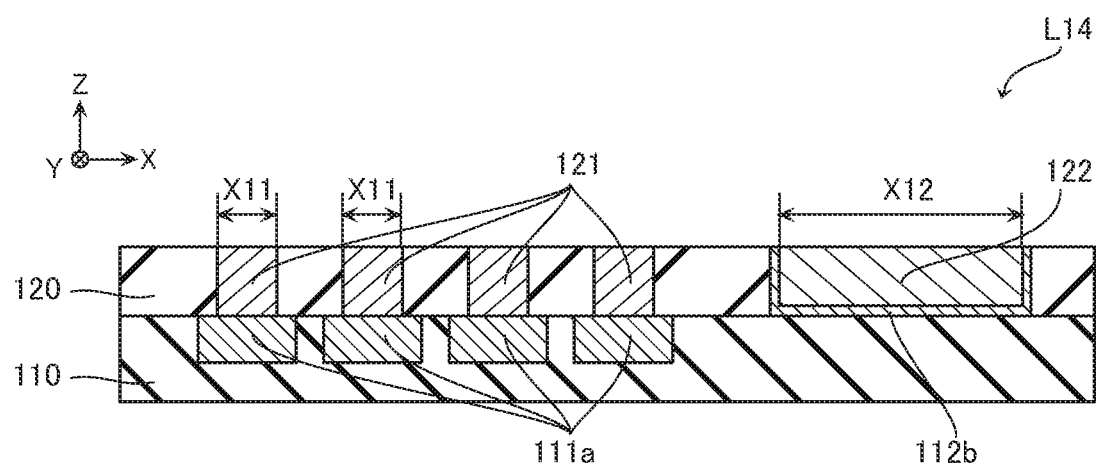
FIG. 17 is a schematic cross-sectional view illustrating a part of the configuration of the modification 2 of the semiconductor device.

The semiconductor device according to the modification 2 of the first embodiment may include, for example, a wiring portion L14 as illustrated in FIG. 17. FIG. 17 is a schematic XZ cross-sectional view illustrating a part of a configuration of the wiring portion L14.

In the wiring portion L14, the conductive layer 111 similar to that in the wiring portion L10 of the first embodiment is not disposed. However, in the wiring portion L14, the above-described plurality of conductive layers 11a that are in contact with the lower end surfaces in the Z-direction of the plurality of conductive layers 121 are disposed. Further, in the wiring portion L14, the above-described conductive layer 112b that is in contact with the outer peripheral surfaces of the conductive layer 122 is disposed.

Modification 3 of First Embodiment

Figure 18:
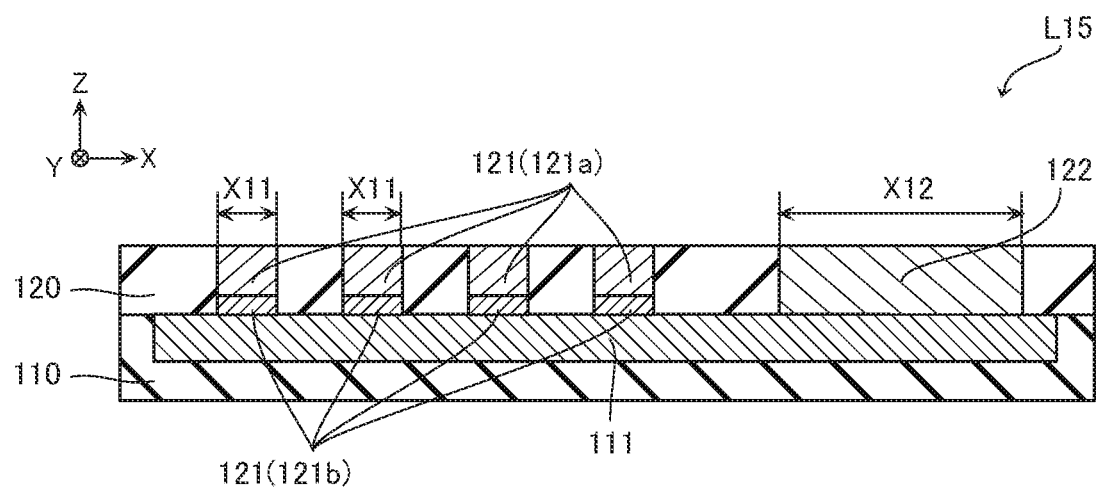
FIG. 18 is a schematic cross-sectional view illustrating a part of a configuration of a modification 3 of the semiconductor device.
Figure 19:
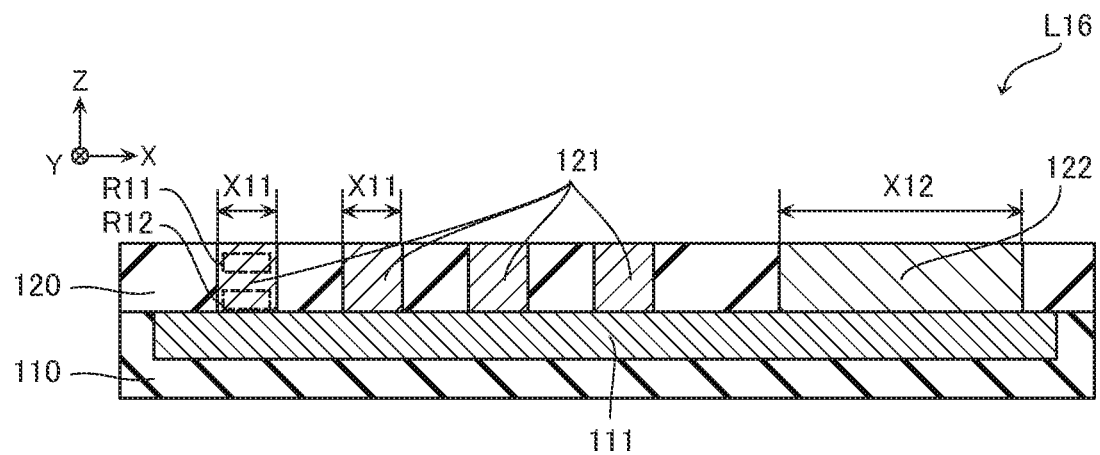
FIG. 19 is a schematic cross-sectional view illustrating a part of the configuration of the modification 3 of the semiconductor device.

Next, with reference to FIG. 18 and FIG. 19, a modification 3 of the semiconductor device according to the first embodiment is described.
[Wiring Portion L15]
The semiconductor device according to the modification 3 of the first embodiment may include, for example, a wiring portion L15 as illustrated in FIG. 18. FIG. 18 is a schematic XZ cross-sectional view illustrating a part of a configuration of the wiring portion L15.

In the wiring portion L15, the conductive layer 121 includes a first part 121a, and a second part 121b that is closer to the conductive layer 111 than the first part 121a. The first metal of the second part 121b has a concentration higher than a concentration of the first metal of the first part 121a.
[Wiring Portion L16]
The semiconductor device according to the modification 3 of the first embodiment may include, for example, a wiring portion L16 as illustrated in FIG. 19. FIG. 19 is a schematic XZ cross-sectional view illustrating a part of a configuration of the wiring portion L16.

In the wiring portion L16, the conductive layer 121 includes a first region R11, and a second region R12 that is closer to the conductive layer 111 than the first region R11. The first metal of the second region R12 has a concentration higher than a concentration of the first metal in the first region R11. In the wiring portion L16, a concentration gradient of the first metal may be formed in the conductive layers 121 so that the concentration of the first metal becomes higher as approaching the conductive layer 111.

In the wiring portion L16, a concentration ratio between the first metal and the second metal in the second region R12 may be higher than a concentration ratio between the first metal and the second metal in the first region R11.

Effect of Modification 3 of First Embodiment

In order to efficiently reduce the interface resistivity between the conductive layers 121 and the conductive layer 111, it is especially preferred to increase a carrier density of a part of the conductive layer 121 that is close to the conductive layer 111. Therefore, similarly to the structure described with reference to FIG. 18 and FIG. 19, by increasing the concentration of the first metal of the part of the conductive layer 121 that is close to the conductive layer 111, the interface resistivity can be effectively reduced. Additionally, by increasing the concentration of the first metal of the part of the conductive layer 121 that is close to the conductive layer 111, the concentration of the first metal can be reduced to be low as the entire conductive layer 121. In such a case, the above-described bond strain in association with the increase in the concentration of the first metal can be reduced while lowering the interface resistivity, and the occurrence of the failures, such as stress migration and electromigration, can be reduced.

Second Embodiment

Figure 20:
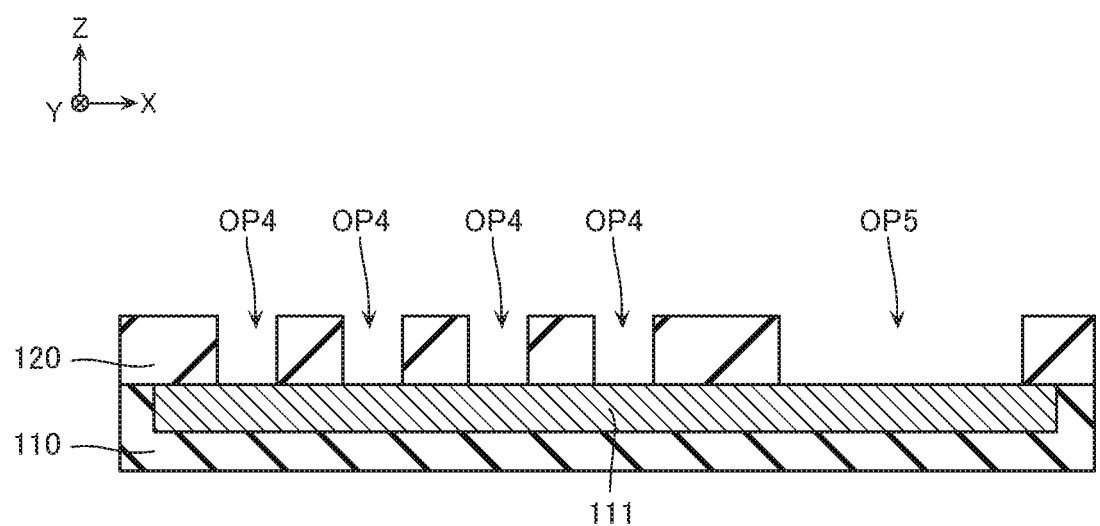
FIG. 20 is a schematic cross-sectional view for describing a method of manufacturing the semiconductor device according to a second embodiment.
Figure 21:
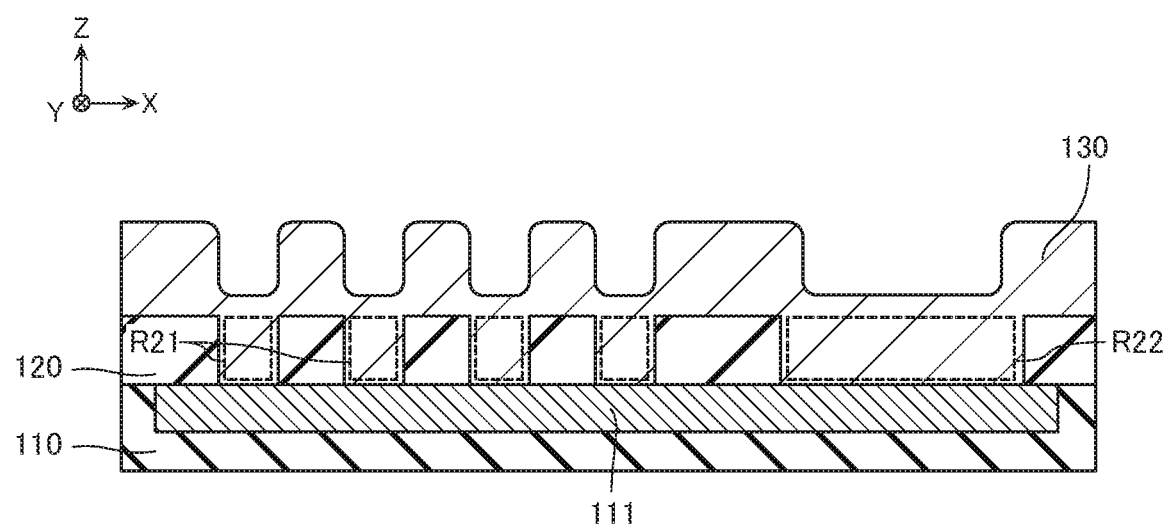
FIG. 21 is a schematic cross-sectional view for describing the manufacturing method.

Next, using FIGS. 1A to 1C, FIG. 20, and FIG. 21, a semiconductor device according to a second embodiment and a method of manufacturing the semiconductor device are described. In the following description, same reference numerals are attached to configurations similar to those of the first embodiment, and their descriptions are omitted.
[Configuration]
The semiconductor device according to the second embodiment includes, for example, the wiring portion L10 similar to that of the first embodiment as illustrated in FIG. 1A and FIG. 1B. However, the semiconductor device according to the second embodiment is manufactured using the manufacturing method different from that of the first embodiment.
[Manufacturing Method]
Next, with reference to FIG. 20 and FIG. 21, the method of manufacturing the semiconductor device according to the embodiment is described. FIG. 20 and FIG. 21 are schematic cross-sectional views for describing the method of manufacturing the semiconductor device according to the second embodiment and correspond to the part illustrated in FIG. 1A.

In the manufacturing method, first, for example, the processes similar to the processes described with reference to FIG. 2 to FIG. 6 are performed.

Next, as illustrated in FIG. 20, for example, a plurality of openings OP4 and an opening OP5 are respectively formed in positions corresponding to the plurality of conductive layers 121 and the conductive layer 122 in the insulating layer 120. The plurality of openings OP4 and the opening OP5 extend in the Z-direction and penetrate the insulating layer 120 to expose the conductive layer 111. The plurality of openings OP4 and the opening OP5 are formed so that the smaller one of a width in the X-direction and a width in the Y-direction of the opening OP5 becomes larger than a width in the X-direction of the openings OP4. This process is performed by, for example, a method, such as RIE.

Next, as illustrated in FIG. 21, for example, a conductive layer 130 is formed on the upper surface of the insulating layer 120 and inside the plurality of openings OP4 and the opening OP5. The conductive layer 130 contains, for example, a material similar to that of the conductive layers 121 and the conductive layer 122. This process is performed by, for example, sputtering or a method, such as CVD. In this process, the conductive layer 130 is formed so that a concentration of the first metal in regions R21 formed in positions corresponding to the conductive layers 121 becomes higher than a concentration of the first metal in a region R22 formed in a position corresponding to the conductive layer 122. Details of this process of forming the conductive layer 130 will be described later.

Next, a part of the conductive layer 130 formed outside parts where the plurality of openings OP4 and the opening OP5 have existed is removed and planarized to form the conductive layers 121 and the conductive layer 122, and the structure described with reference to FIGS. 1A to 1C is formed. This process is performed by, for example, a method, such as Chemical Mechanical Planarization (CMP).
[Process of Forming Conductive Layer 130]
The process of forming the conductive layer 130 is described. Here, a case where the process of forming the conductive layer 130 is performed by sputtering is described.

In sputtering, when a sputtering target containing the first metal, the second metal, and oxygen (O) is used, a composition of the sputtering target and a composition of a formed film are different in some cases depending on a difference in sputtering efficiency for each element. The sputtering efficiency for each element is expressed, for example, as a difference between a count of particles that collide with a film-formed portion and a count of particles that are pushed out from the film-formed portion by the collision for each element. Such sputtering efficiency varies according to a shape of the film-formed portion, a density of the formed film, an atomic weight of a constituent element, and the like.

A case where the conductive layer 130 is simultaneously embedded into the openings OP4 having a small width and the opening OP5 having a wide width by sputtering as illustrated in FIG. 20 is equivalent to the case where the shape of the film-formed portion is different. In such a case, by performing a film formation by a condition in which the sputtering efficiency is different depending on the width of the opening (such as a condition in which a substrate bias voltage is high during sputtering), the concentration of the first metal in the regions R21 embedded in the openings OP4 having a small width can be set to be high, and the concentration of the first metal in the region R22 embedded in the opening OP5 having a large width can be set to be low.

Third Embodiment

Figure 22:
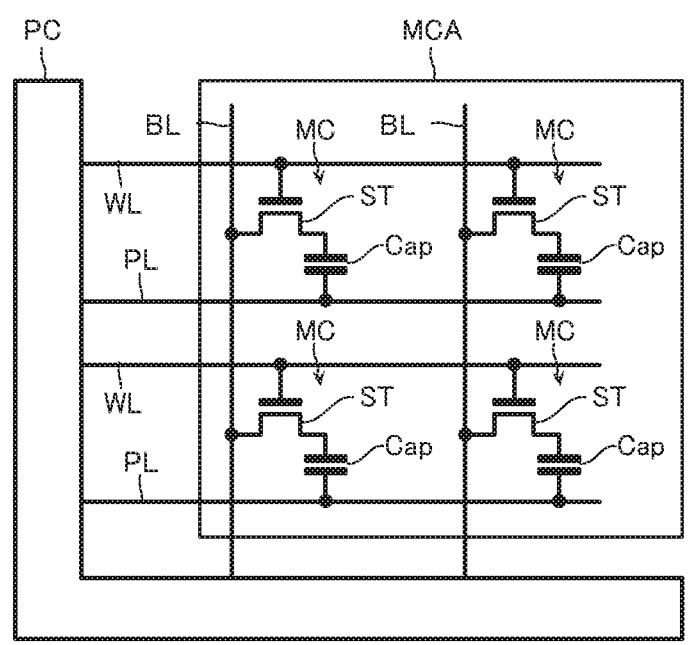
FIG. 22 is a schematic circuit diagram illustrating a part of a configuration of a semiconductor device according to a third embodiment.
Figure 23A:
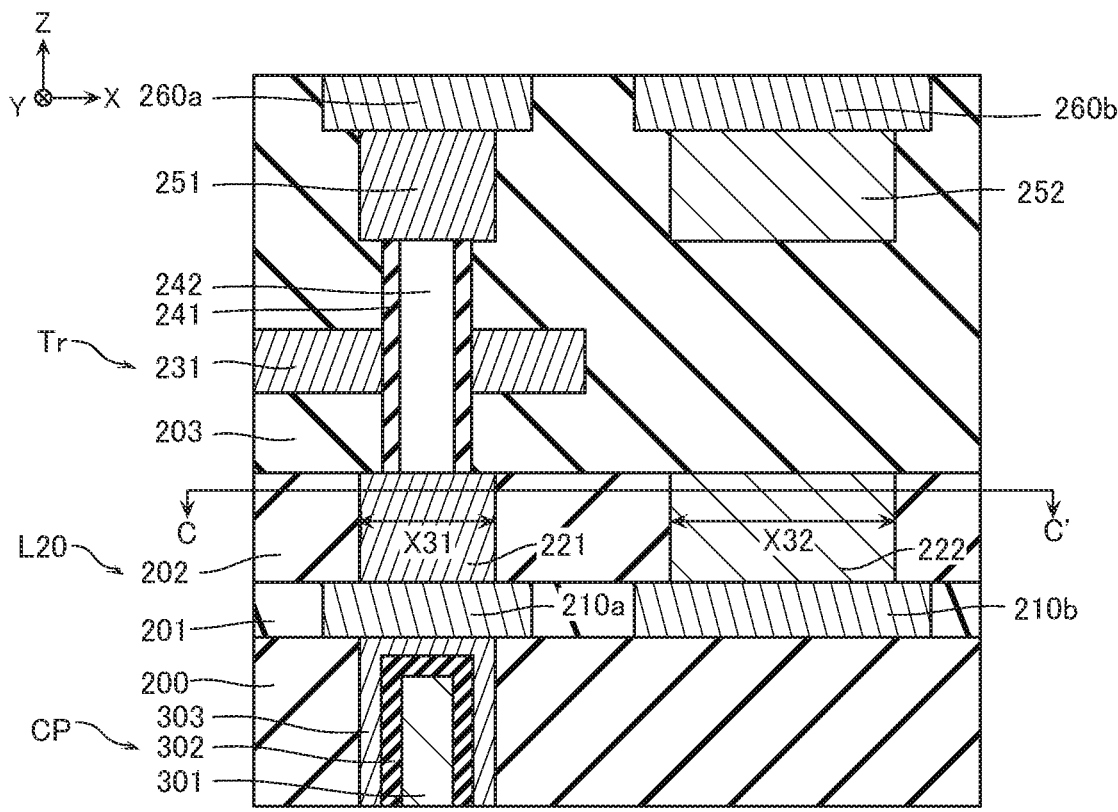
FIG. 23A is a schematic cross-sectional view illustrating a part of the configuration of the semiconductor device.
Figure 23B:
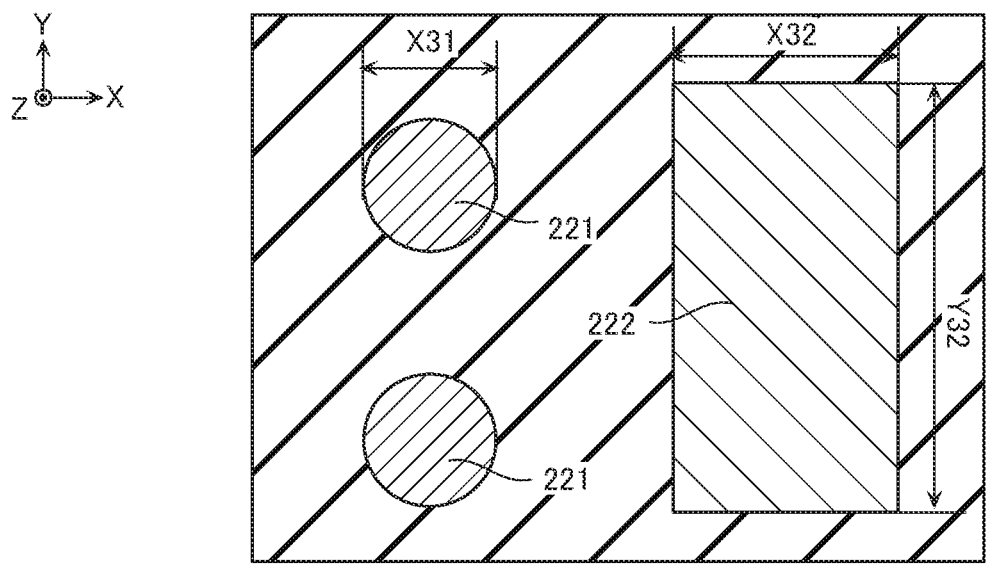
FIG. 23B is a schematic plan view illustrating a part of the configuration of the semiconductor device.

Next, using FIG. 22 and FIGS. 23A and 23B, a semiconductor device according to a third embodiment is described. FIG. 22 is a schematic circuit diagram illustrating a part of a configuration of a memory cell array MCA. FIG. 23A is a schematic XZ cross-sectional view illustrating a part of a configuration of the semiconductor device according to the embodiment. FIG. 23B is a schematic XY cross-sectional view of the configuration illustrated in FIG. 23A taken along the line C-C' and viewed along an arrow direction.

[Circuit Configuration]

The semiconductor device according to the third embodiment includes, for example, a memory cell array MCA and a peripheral circuit PC as illustrated in FIG. 22.

The memory cell array MCA includes a plurality of bit lines BL, a plurality of word lines WL, a plurality of plate lines PL, and a plurality of memory cells MC that are connected to these plurality of bit lines BL, plurality of word lines WL, and plurality of plate lines PL. A plurality of memory cells MC connected to one word line WL are connected to the respective mutually different bit lines BL. A plurality of memory cells MC connected to one bit line BL are connected to the respective mutually different word lines WL.

Each of the memory cells MC includes a select transistor ST and a capacitor Cap that are connected in series between the bit line BL and the plate line PL.

The select transistor ST is a field-effect type transistor including a semiconductor layer that functions as a channel region, a gate insulating film, and a gate electrode. Each gate electrode of the select transistors ST is connected to the word line WL.

The capacitor Cap is a capacitor that includes a pair of electrodes and an insulating film including a memory portion.

The peripheral circuit PC includes, for example, a voltage generation circuit that generates an operating voltage and outputs the operating voltage to a voltage supply line, a decode circuit that electrically conducts a desired voltage supply line to each of the wirings (the bit lines BL, the word lines WL, and the plate lines PL) in the memory cell array MCA, a sense amplifier circuit that senses a current or a voltage of the bit lines BL, and the like.

[Structure]

Next, a transistor structure Tr that constitutes the select transistor ST, a capacitor structure CP that constitutes the capacitor Cap, and a wiring portion L20 that is disposed between the select transistor ST and the capacitor Cap and connects them are described with reference to FIGS. 23A and 23B.

[Transistor Structure Tr]

The transistor structure Tr includes conductive layers 221, an insulating layer 203 disposed on an upper side of the conductive layers 221, conductive layers 251 disposed above the conductive layers 221, semiconductor layers 242 that are disposed between the conductive layers 221 and the conductive layers 251 and contacted to the conductive layers 221 and the conductive layers 251, insulating layers 241 disposed on outer circumferential surfaces of the semiconductor layers 242, conductive layers 231 disposed in parts of the outer circumferential surfaces of the insulating layers 241, and a conductive layer 260a disposed on upper surfaces of the conductive layers 251. The insulating layer 203 contains, for example, silicon oxide ($SiO_2$) or the like.

The conductive layers 221 function as, for example, drain electrodes of the select transistors ST (FIG. 22). The conductive layer 221 contains, for example, the first metal, the second metal, and oxygen (O) similar to the above-described conductive layers 121. The conductive layer 221 has an approximately circular shape on the XY cross-sectional surface and may have a plug shape. The conductive layers 221 have lower surfaces in the Z-direction contacted to a conductive layer 210a. A width in the X-direction of the conductive layers 221 is a width X31.

The conductive layers 231 function as, for example, gate electrodes of the select transistors ST (FIG. 22). The conductive layer 231 includes, for example, a stacked structure of titanium nitride (TiN) and tungsten (W), or the like.

The insulating layers 241 function as, for example, gate insulating films of the select transistors ST (FIG. 22). The insulating layer 241 contains, for example, silicon oxide ($SiO_2$) or the like.

The semiconductor layers 242 function as, for example, channel regions of the select transistors ST (FIG. 22). The semiconductor layer 242 may be, for example, a semiconductor containing at least one element of gallium (Ga) and aluminum (Al), indium (In), zinc (Zn), and oxygen (O), or may be another oxide semiconductor.

The conductive layers 251 function as, for example, source electrodes of the select transistors ST (FIG. 22). The conductive layer 251 contains, for example, the first metal, the second metal, and oxygen (O), similarly to the conductive layer 221. A width in the X-direction of the conductive layers 251 is approximately the same as the width X31 in the X-direction of the conductive layers 221.

Note that a conductive layer 252 may be disposed in a position arranged with the conductive layers 251 in the X-direction. The conductive layer 252 contains, for example, the first metal, the second metal, and oxygen (O), similarly to the conductive layer 251. The concentration of the first metal of the conductive layer 252 may be higher than the concentration of the first metal of the conductive layers 251, or may be approximately the same. A width in the X-direction of the conductive layer 252 is approximately the same as a width in the X-direction of a conductive layer 222 described later.

The conductive layer 260a functions as, for example, the bit line BL (FIG. 22) of the memory cell array MCA. The conductive layer 260a may extend in the Y-direction and be contacted to upper surfaces in the Z-direction of the plurality of conductive layers 251 arranged in the Y-direction. The conductive layer 260a contains, for example, a material similar to that of the above-described conductive layer 111, such as titanium nitride (TiN).

Note that a conductive layer 260b may be disposed in a position arranged with the conductive layer 260a in the X-direction. A lower surface in the Z-direction of the conductive layer 260b may be contacted to the conductive layer 252. The conductive layer 260b contains, for example, a material similar to that of the above-described conductive layer 111, such as titanium nitride (TiN).

[Wiring Portion L20]

As illustrated in FIG. 23A, for example, the wiring portion L20 includes an insulating layer 201 and an insulating layer 202, the conductive layer 210a and a conductive layer 210b disposed in the insulating layer 201, the insulating layer 202 disposed on upper surfaces of the insulating layer 201, the conductive layer 210a, and the conductive layer 210b, the above-described conductive layers 221 disposed so as to penetrate the insulating layer 202 and be in contact with the conductive layer 210a, and the conductive layer 222 disposed so as to penetrate the insulating layer 202 and be in contact with the conductive layer 210b. The insulating layer 201 and the insulating layer 202 contain, for example, silicon oxide ($SiO_2$) or the like.

The conductive layer 210a functions as, for example, a wiring that connects the conductive layers 221 to the capacitor structure CP. The conductive layer 210a contains, for example, a material similar to that of the above-described conductive layer 111, such as titanium nitride (TiN).

The conductive layer 210b functions as, for example, a dummy pattern and a lower wiring of a peripheral circuit. The conductive layer 210b contains, for example, a material similar to that of the above-described conductive layer 111, such as titanium nitride (TiN).

The conductive layer 222 functions as, for example, a dummy pattern or a lower wiring of a peripheral circuit. As illustrated in FIGS. 23A and 23B, for example, the conductive layer 222 is disposed to be arranged with the conductive layers 221 in the X-direction. The conductive layer 222 has a lower surface in the Z-direction contacted to the conductive layer 210b. A width in the X-direction of the conductive layer 222 is a width X32. A width in the Y-direction of the conductive layer 222 is a width Y32. The smaller one of the width X32 and the width Y32 is larger than the width X31 in the X-direction of the conductive layers 221.

The conductive layers 221 and the conductive layer 222 contain the first metal, the second metal, and oxygen (O) similar to those of the first embodiment. The first metal of the conductive layers 221 has a concentration higher than a concentration of the first metal of the conductive layer 222.

[Capacitor Structure CP]

As illustrated in FIG. 23A, for example, the capacitor structure CP includes an insulating layer 200, conductive layers 301 disposed in the insulating layer 200, insulating layers 302 disposed on upper surfaces and side surfaces in the X-direction and the Y-direction of the conductive layers 301, and conductive layers 303 disposed on upper surfaces and side surfaces in the X-direction and the Y-direction of the insulating layers 302. The insulating layer 200 contains, for example, silicon oxide ($SiO_2$) or the like.

The conductive layers 301 function as ones of the electrodes of the capacitors Cap (FIG. 22). The conductive layer 301 includes, for example, a stacked structure of titanium nitride (TiN) and tungsten (W), or the like. The conductive layers 301 are electrically connected to the plate lines PL (FIG. 22).

The insulating layers 302 function as insulating layers between electrodes of the capacitor structure CP. The insulating layer 302 contains, for example, silicon oxide ($SiO_2$) or the like. The insulating layer 302 may be, for example, alumina ($Al_2O_3$) or another insulating metal oxide.

The conductive layers 303 function as, for example, the others of the electrodes of the capacitors Cap (FIG. 22). The conductive layer 303 includes, for example, a stacked structure of titanium nitride (TiN) and tungsten (W), or the like. The conductive layers 303 are contacted to lower end surfaces in a Z-direction of the conductive layer 210a.

Effect of Third Embodiment

Recently, development of a semiconductor device in which an oxide semiconductor having a higher mobility is used has been proceeding. The oxide semiconductor having a high mobility contains, for example, indium (In), gallium (Ga), and zinc (Zn).

It has been known that characteristics of the semiconductor device in which the oxide semiconductor is used vary depending on an amount of oxygen defect included in the oxide semiconductor. When a general metallic material is used as an electrode material that comes in contact with such an oxide semiconductor, a redox reaction occurs on the interface. The oxygen defect amount in the oxide semiconductor increases by this redox reaction, causing transistor characteristics to vary in some cases.

In order to avoid such an increase in the oxygen defect amount, in the embodiment, as illustrated in FIG. 23A, an oxide conductor containing the first metal, the second metal, and oxygen (O) is used for the conductive layers 221 and the conductive layers 251 that come in contact with the semiconductor layers 242 that are the oxide semiconductor. Accordingly, an increase in oxygen defect in the semiconductor layers 242 is restrained.

However, for example, when a general metallic material is employed in the conductive layer 210a and the conductive layer 260a that respectively come in contact with the conductive layers 221 and the conductive layers 251, the redox reaction occurs on the interfaces, causing the interface resistivity to increase in some cases.

Therefore, in the semiconductor device according to the embodiment, the concentration of the first metal is set to be high for those having a relatively small width such as the conductive layers 221 and the conductive layers 251, and the concentration of the first metal is set to be low for those having a relatively large width such as the conductive layer 222.

In such a configuration, similarly to the contact between the conductive layers 221 and the conductive layer 210a and the contact between the conductive layers 251 and the conductive layer 260a, even when a contact area is relatively small and a contact resistance easily increases, the interface resistivity can be set to be relatively small. Therefore, even in contact of these relatively small areas, the contact resistance can be set to be relatively small.

Additionally, in such a configuration, similarly to the contact between the conductive layer 222 and the conductive layer 210b, even when a contact area is relatively large, the bond strain in the material can be reduced to be small by lowering the concentration of the first metal of the conductive layer 222. Therefore, even in the conductive layer 222 having a relatively large volume, the total quantity of the strain can be set to be relatively small and the occurrence of the failures, such as stress migration and electromigration, can be reduced. By thus reducing the total quantity of the strain to be relatively small, contact strength of the conductive layer 222 and the conductive layer 210b can be increased, pattern peeling and the like can be restrained especially in a CMP process, and a process reliability can be enhanced.

In the above description, an example in which the capacitor Cap is connected to the select transistor ST has been described. In such an example, a shape, structure, and the like of the capacitor Cap are adjustable as appropriate.

Further, in the above description, an example in which the capacitor Cap is employed as the memory portion connected to the select transistor ST has been described. However, the memory portion need not be the capacitor Cap. For example, the memory portion may be one that contains ferroelectric material, ferromagnet material, chalcogen material such as GeSbTe or another material, and stores data using the characteristics of these materials. For example, in any of the structures described above, any of these materials may be included in the insulating layer between the electrodes forming the capacitor Cap.

Other Embodiments

The semiconductor devices according to the first embodiment to the third embodiment have been described above. However, the semiconductor devices according to these embodiments are only examples, and a specific configuration, operations, and the like are adjustable as appropriate.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a plurality of first conductive layers arranged in a first direction and a second direction intersecting with the first direction or arranged in the first direction and extending in the second direction, a width in the first direction thereof being a first width;
a second conductive layer arranged with the plurality of first conductive layers in the first direction or the second direction, a smaller one of a width in the first direction thereof and a width in the second direction thereof being a second width that is larger than the first width;
a third conductive layer in contact with one end portion of at least one of the plurality of first conductive layers in a third direction intersecting with the first direction and the second direction; and
a fourth conductive layer in contact with one end portion of the second conductive layer in the third direction, wherein
the at least one of the plurality of first conductive layers and the second conductive layer contain a first metal, a second metal different from the first metal, and oxygen (O), and
a concentration of the first metal of the at least one of the plurality of first conductive layers is higher than a concentration of the first metal of the second conductive layer.

2. The semiconductor device according to claim 1, wherein
the at least one of the plurality of first conductive layers includes a first region and a second region closer to the third conductive layer than the first region, and
a concentration of the first metal of the second region is higher than a concentration of the first metal of the first region.

3. The semiconductor device according to claim 1, wherein
in a first cross-sectional surface extending in the first direction and the second direction and including the plurality of first conductive layers, the third conductive layer surrounds outer circumferential surface of at least one of the plurality of first conductive layers and is in contact with the outer circumferential surfaces of the at least one of the plurality of first conductive layers.

4. The semiconductor device according to claim 1, wherein
in a second cross-sectional surface extending in the first direction and the second direction and including the second conductive layer, the fourth conductive layer surrounds at least a part of an outer circumferential surface of the second conductive layer and is in contact with the at least a part of the outer circumferential surface of the second conductive layer.

5. The semiconductor device according to claim 1, wherein
the first metal is at least one of tin (Sn), niobium (Nb), titanium (Ti), or tungsten (W).

6. The semiconductor device according to claim 1, wherein
a concentration ratio between the first metal and the second metal of the at least one of the plurality of first conductive layers is higher than a concentration ratio between the first metal and the second metal of the second conductive layer.

7. The semiconductor device according to claim 2, wherein
a concentration ratio between the first metal and the second metal in the second region is higher than a concentration ratio between the first metal and the second metal in the first region.

8. The semiconductor device according to claim 5, wherein
the second metal is indium (In).

9. The semiconductor device according to claim 1, wherein
each of the third conductive layer and the fourth conductive layer contains at least one of tungsten (W), aluminum (Al), tantalum (Ta), titanium (Ti), or silicon (Si).

10. The semiconductor device according to claim 1, wherein
the third conductive layer is in contact with the fourth conductive layer.

11. The semiconductor device according to claim 1, wherein
the third conductive layer is separated from the fourth conductive layer.

12. The semiconductor device according to claim 9, comprising:
a seventh conductive layer arranged with one of the plurality of first conductive layers in the third direction;

an oxide semiconductor layer disposed between the one of the plurality of first conductive layers and the seventh conductive layer, the oxide semiconductor layer being in contact with the one of the plurality of first conductive layers and the seventh conductive layer; and an eighth conductive layer surrounding the oxide semiconductor layer.

13. A manufacturing method of a semiconductor device, wherein the semiconductor device includes:
- a plurality of first conductive layers arranged in a first direction and a second direction intersecting with the first direction or arranged in the first direction and extending in the second direction, a width in the first direction thereof being a first width;
- a second conductive layer arranged with the plurality of first conductive layers in the first direction or the second direction, a smaller one of a width in the first direction thereof and a width in the second direction thereof being a second width that is larger than the first width;
- a third conductive layer in contact with one end portion of at least one of the plurality of first conductive layers in a third direction intersecting with the first direction and the second direction; and
- a fourth conductive layer in contact with one end portion of the second conductive layer in the third direction, wherein the at least one of the plurality of first conductive layers and the second conductive layer contain a first metal, a second metal different from the first metal, and oxygen (O), and a concentration of the first metal of the at least one of the plurality of first conductive layers is higher than a concentration of the first metal of the second conductive layer, wherein the manufacturing method of the semiconductor device comprising:
- forming a first insulating layer;
- forming a plurality of first openings in positions corresponding to the plurality of first conductive layers in the first insulating layer;
- forming the plurality of first conductive layers inside the plurality of first openings;
- forming a second opening in a position corresponding to the second conductive layer in the first insulating layer after forming the plurality of first conductive layers; and
- forming the second conductive layer inside the second opening.

14. The manufacturing method of the semiconductor device according to claim 13, comprising:
forming the third conductive layer and the fourth conductive layer before forming the first insulating layer,
forming the plurality of first openings penetrating the first insulating layer to expose the third conductive layer, and
forming the second opening penetrating the first insulating layer to expose the fourth conductive layer.

15. The manufacturing method of the semiconductor device according to claim 13, wherein
the third conductive layer is formed inside one of the plurality of first openings before the plurality of first conductive layers are formed, and the fourth conductive layer is formed inside the second opening before the second conductive layer is formed.

16. The manufacturing method of the semiconductor device according to claim 13, wherein
the first conductive layers and the second conductive layer are formed by a sputtering method.

17. The manufacturing method of the semiconductor device according to claim 13, wherein
the first conductive layers and the second conductive layer are formed by a CVD method.

18. A manufacturing method of a semiconductor device, wherein the semiconductor device includes:
- a plurality of first conductive layers arranged in a first direction and a second direction intersecting with the first direction or arranged in the first direction and extending in the second direction, a width in the first direction thereof being a first width;
- a second conductive layer arranged with the plurality of first conductive layers in the first direction or the second direction, a smaller one of a width in the first direction thereof and a width in the second direction thereof being a second width that is larger than the first width;
- a third conductive layer in contact with one end portion of at least one of the plurality of first conductive layers in a third direction intersecting with the first direction and the second direction; and
- a fourth conductive layer in contact with one end portion of the second conductive layer in the third direction, wherein the at least one of the plurality of first conductive layers and the second conductive layer contain a first metal, a second metal different from the first metal, and oxygen (O), and a concentration of the first metal of the at least one of the plurality of first conductive layers is higher than a concentration of the first metal of the second conductive layer, wherein the manufacturing method of the semiconductor device comprising:
- forming a first insulating layer;
- forming a plurality of first openings and a second opening respectively in positions corresponding to the plurality of first conductive layers and in a position corresponding to the second conductive layer in the first insulating layer; and
- forming the plurality of first conductive layers and the second conductive layer respectively inside the plurality of first openings and inside the second opening after forming the plurality of first openings and the second opening.

19. The manufacturing method of the semiconductor device according to claim 18, wherein
the first conductive layers and the second conductive layer are formed by a sputtering method.

20. The manufacturing method of the semiconductor device according to claim 18, wherein
the first conductive layers and the second conductive layer are formed by a CVD method.

* * * * *